United States Patent
Kawasaki

(10) Patent No.: US 8,427,231 B2
(45) Date of Patent: Apr. 23, 2013

(54) AMPLIFYING DEVICE AND AMPLIFYING METHOD

(75) Inventor: Toshio Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/327,031

(22) Filed: Dec. 15, 2011

(65) Prior Publication Data

US 2012/0161865 A1 Jun. 28, 2012

(30) Foreign Application Priority Data

Dec. 28, 2010 (JP) ................................ 2010-293839

(51) Int. Cl.
*H03F 3/68* (2006.01)

(52) U.S. Cl.
USPC ........................... 330/124 R; 330/295; 330/53

(58) Field of Classification Search .............. 330/124 R, 330/295, 53, 69
See application file for complete search history.

(56) References Cited

U.S. PATENT DOCUMENTS

| | | | |
|---|---|---|---|
| 4,998,074 A * | 3/1991 | Van Lammeren et al. .... | 330/252 |
| 5,117,203 A * | 5/1992 | Tennyson ..................... | 330/294 |
| 6,232,840 B1 * | 5/2001 | Teeter et al. ................. | 330/295 |
| 6,567,327 B2 * | 5/2003 | Tsuchi ......................... | 365/203 |
| 7,061,317 B2 * | 6/2006 | Petrovic et al. .............. | 330/149 |
| 7,298,203 B2 * | 11/2007 | Wang et al. ...................... | 330/9 |
| 7,733,169 B2 * | 6/2010 | Zhang et al. ..................... | 330/9 |

FOREIGN PATENT DOCUMENTS

| | | |
|---|---|---|
| JP | 2004-260707 A | 9/2004 |
| JP | 2007-150905 A | 6/2007 |
| JP | 2007-174148 A | 7/2007 |

\* cited by examiner

*Primary Examiner* — Patricia Nguyen
(74) *Attorney, Agent, or Firm* — Fujitsu Patent Center

(57) ABSTRACT

An amplifying device includes a signal separating unit that separates a first signal and a second signal from an input signal; a first signal-generating unit that generates, based on the first signal, a first cancelling signal that suppresses ringing caused during processing of the first signal; a first combining unit that combines the first signal and the first cancelling signal; a first amplifying unit that amplifies a signal output from the first combining unit; a second signal-generating unit that generates, based on the second signal, a second cancelling signal that suppresses ringing caused during processing of the second signal; a second combining unit that combines the second signal and the second cancelling signal; a second amplifying unit that amplifies a signal output from the second combining unit; and a third combining unit that combines a signal output from the first amplifying unit and one output from the second amplifying unit.

9 Claims, 10 Drawing Sheets

AMPLIFYING DEVICE AND AMPLIFYING METHOD

CROSS REFERENCE TO RELATED APPLICATIONS

This application is based upon and claims the benefit of priority of the prior Japanese Patent Application No. 2010-293839, filed on Dec. 28, 2010, the entire contents of which are incorporated herein by reference.

FIELD

The embodiments discussed herein are related to an amplifying device and an amplifying method.

BACKGROUND

A high-frequency amplifying device that uses a saturated amplifier based on linear amplification with nonlinear components (LINC) is known as a highly-efficient linear amplifying device. FIG. 9 is a block diagram of a conventional amplifying device. As depicted in FIG. 9, the amplifying device includes a signal separating unit, digital to analog converters (D/As) 2 and 12, low pass filters (LPFs) 3 and 13, quadrature modulators (QMODs) 4 and 14, amplifiers 5 and 15, a local oscillation unit 6, and a combining unit 7.

The signal separating unit is connected to an input terminal 8, and separates an input signal (Sin(t)) input from the input terminal 8 and having a variable envelope into a signal pair (Sc1(t), Sc2(t)) having a phase difference according to the amplitude of the input signal (Sin(t)). For example, the input signal (Sin(t)) is an amplitude-modulated signal or a phase-modulated (angle-modulated) signal. Each signal of the signal pair (Sc1(t), Sc2(t)) is a phase-modulated signal having a constant envelope and a constant amplitude. The input signal (Sin(t)) and the signal pair (Sc1(t), Sc2(t)) may be a baseband signal or an intermediate frequency (IF) signal. The signal pair (Sc1(t), Sc2(t)) is generated as a digital signal by the signal separating unit 1.

D/As 2 and 12 are connected to the signal separating unit 1. The D/A 2 converts one signal (Sc1(t)) of the signal pair (Sc1(t), Sc2(t)) output from the signal separating unit 1 into an analog signal. The D/A 12 converts the other signal (Sc2(t)) of the signal pair (Sc1(t), Sc2(t)) output from the signal separating unit 1 into an analog signal.

The LPF 3 is connected to the D/A 2, extracts a component corresponding to the band of frequency of the signal Sc1(t) from the signal output from the D/A 2, and suppresses frequency components other than the band of frequency of the signal Sc1(t). The LPF 13 is connected to the D/A 12, extracts a component corresponding to the band of frequency of the signal Sc2(t) from the signal output from the D/A 12, and suppresses frequency components other than the band of frequency of the signal Sc2(t).

The QMOD 4 is connected to the LPF 3. The QMOD 4 performs a quadrature modulation on the signal output from the LPF 3 using a high-frequency oscillation signal (SL(t)) output from the local oscillation unit 6, and generates one signal (S1(t)) of the high-frequency signal pair (S1(t), S2(t)) that is a radio frequency (RF) signal. The QMOD 14 is connected to the LPF 13. Similar to the QMOD 4, the QMOD 14 performs a quadrature modulation on the signal output from the LPF 13, and generates the other signal (S2(t)) of the high-frequency signal pair (S1(t), S2(t)).

For example, it is assumed that the signal (Sin(t)) input to the signal separating unit 1 is represented by the following equation (1). In this case, the signal pair (Sc1(t), Sc2(t)) output from the signal separating unit 1 and the signal pair (S1(t), S2(t)) output from the QMOD 4 are represented by the following equations (2) to (6).

$$\mathrm{Sin}(t) = a(t) \cdot \cos[\theta(t)] \quad (1)$$

$$Sc1(t) = a_{max} \cdot \cos[\theta(t) + \psi(t)] \quad (2)$$

$$Sc2(t) = a_{max} \cdot \cos[\theta(t) - \psi(t)] \quad (3)$$

$$S1(t) = a_{max} \cdot \cos[2 \cdot \pi \cdot fc \cdot t + \theta(t) + \psi(t)] \quad (4)$$

$$S2(t) = a_{max} \cdot \cos[2 \cdot \pi \cdot fc \cdot t + \theta(t) - \psi(t)] \quad (5)$$

$$\psi(t) = \cos^{-1}[a(t)/(2 \cdot a_{max})] \quad (6)$$

In the equations (1) to (6), a(t) is the amplitude modulation of Sin(t); $\theta(t)$ is the phase modulation (angle modulation) of Sin(t); fc is the frequency of SL(t) and is the carrier frequency of S1(t) and S2(t); and $a_{max}$ is a constant that is set according to the saturation output level of a pair of amplifiers 5 and 15 described later. Thus, the signal separating unit 1, the local oscillation unit 6, and the QMODs 4 and 14 enable a generation of a high-frequency signal pair S1(t) and S2(t) that is phase-modulated such that the phase difference $2 \times \psi(t)$ is generated according to the amplitude of Sin(t).

The amplifying unit 5 is connected to the QMOD 4, and amplifies the signal (S1(t)) output from the QMOD 4. The amplifying unit 15 is connected to the QMOD 14, and amplifies the signal (S2(t)) output from the QMOD 14. The amplifying units 5 and 15 are provided in parallel, and have substantially the same gain and the same phase characteristics. The signal output from the amplifying unit 5 is G×S1(t) and the signal output from the amplifying unit 15 is G×S2(t), where G is the gain of the amplifiers 5 and 15. The amplifiers 5 and 15 are used as saturated amplifiers.

The combining unit 7 is connected to the amplifiers 5 and 15, and combines the signal (G×S1(t)) output from the amplifying unit 5 and the signal (G×S2(t)) output from the amplifying unit 15. The combining unit 7 is connected to an output terminal 9, and outputs the combined high-frequency signal (Sout(t)) from the output terminal 9. For example, the combined high-frequency signal (Sout(t)) is represented by the following equation (7), where $\phi$ is the transmission phase of the signal (S1(t)) output from the QMOD 4 and the signal (S2(t)) output from the QMOD 14.

$$\begin{aligned} Sout(t) &= G \cdot a_{max} \cdot \cos[2 \cdot \pi \cdot fc \cdot t + \theta(t) + \psi(t) + \phi] + \\ & \quad G \cdot a_{max} \cdot \cos[2 \cdot \pi \cdot fc \cdot t + \theta(t) - \psi(t) + \phi] \\ &= 2 \cdot G \cdot a_{max} \cdot \cos[2 \cdot \pi \cdot fc \cdot t + \theta(t) + \phi] \cdot \\ & \quad \cos[\psi(t)] \\ &= G \cdot a(t) \cdot \cos[2 \cdot \pi \cdot fc \cdot t + \theta(t) + \phi] \end{aligned} \quad (7)$$

As represented by the equation (7), the amplifying device depicted in FIG. 9 can obtain a high-frequency output signal Sout(t) that is the signal Sin(t) input to the signal separating unit 1 and amplified by the gain G, and can perform highly-efficient linear amplification on the input signal.

As such an amplifying device using a saturated LINC amplifier, an amplifying device is known that separates an input signal into the in-phase signals and the quadrature signals, amplifies the signals respectively according to the method described above, and orthogonally adds the signals again. An amplifying device is also known that feeds back the signal output from the amplifying device, and corrects the phase of each signal of the signal pair separated by a signal separating unit. Related technologies are described in, for example, Japanese Laid-open Patent Publication Nos. 2007-150905, 2004-260707, and 2007-174148.

However, conventional amplifying devices have the following problem. When a signal of which carrier polarity reverses, such as the phase shift keying (PSK) signal, is input to the conventional amplifying devices, the digital signal pair generated by the signal separating unit includes a point where the phase reverses by 180 degrees, thereby increasing the band width significantly. However, a digital signal can represent only up to half of the sampling frequency due to the Nyquist theorem. As a result, the signal that is converted into an analog signal by the D/A and from which folded components are removed by the LPF includes high ringing, and becomes a different signal from a constant-envelope signal.

FIGS. 10 and 11 are diagrams of an example of the constellation of the output signal pair when the signal input to the conventional amplifying devices has 2 tones. FIG. 10 illustrates the constellation of the output signal pair before the analog conversion. FIG. 11 illustrates the constellation of the output signal pair that has passed through the LPF (smoothing filter) after the analog conversion. The output signal pair after passing through the smoothing filter includes an amplitude component due to the influence of ringing. As a result, the combined high-frequency output signal is deteriorated and distorted if the output signal pair after the analog conversion is affected by AM/AM distortion (amplitude distortion) and/or AM/PM distortion (phase distortion) during the amplification.

SUMMARY

According to an aspect of an embodiment, an amplifying device includes a signal separating unit that separates a first signal and a second signal from an input signal; a first signal-generating unit that generates, based on the first signal, a first cancelling signal that can suppress ringing caused during processing of the first signal; a first combining unit that combines the first signal and the first cancelling signal; a first amplifying unit that amplifies a signal output from the first combining unit; a second signal-generating unit that generates, based on the second signal, a second cancelling signal that can suppress ringing caused during processing of the second signal; a second combining unit that combines the second signal and the second cancelling signal; a second amplifying unit that amplifies a signal output from the second combining unit; and a third combining unit that combines a signal output from the first amplifying unit and a signal output from the second amplifying unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of an amplifying device and an amplifying method will be described in detail with reference to the accompanying drawings. The amplifying device and the amplifying method separate a signal input to the amplifying device into a pair of signals, combine a ringing cancelling signal to each separated signal, and combine the signals after amplification. In the following embodiments, same components are assigned same signs and description thereof is omitted.

Figure 1:
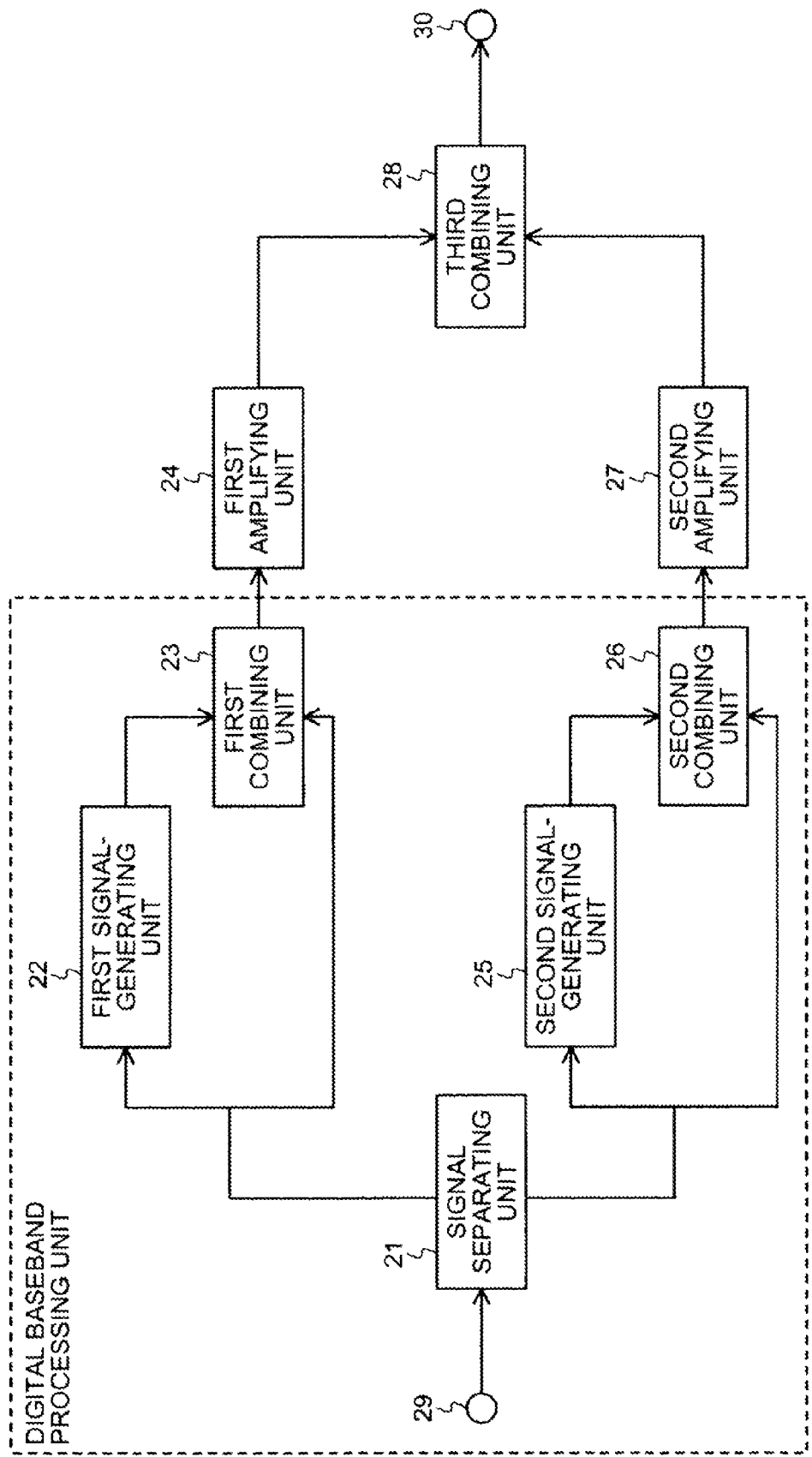
FIG. 1 is a block diagram of an amplifying device according to a first embodiment.

FIG. 1 is a block diagram of an amplifying device according to a first embodiment. As depicted in FIG. 1, the amplifying device includes a signal separating unit 21, a first signal-generating unit 22, a first combining unit 23, a first amplifying unit 24, a second signal-generating unit 25, a second combining unit 26, a second amplifying unit 27, and a third combining unit 28. The signal separating unit 21, the first signal-generating unit 22, the first combining unit 23, the second signal-generating unit 25, and the second combining unit 26 are included in a digital baseband processing unit implemented by a processor such as a digital signal processor (DSP), a field programmable gate array (FPGA), and a central processing unit (CPU). The signal separating unit 21 is connected to an input terminal 29, and separates a first signal and a second signal from the signal input from the input terminal 29.

The first signal-generating unit 22 is connected to the signal separating unit 21 and generates, based on the first signal, a first cancelling signal that can suppress ringing caused during processing of the first signal by the amplifying device. The first combining unit 23 is connected to the signal separating unit 21 and the first signal-generating unit 22, and combines the first signal and the first cancelling signal. The first amplifying unit 24 is connected to the first combining unit 23, and amplifies the signal output from the first combining unit 23.

The second signal-generating unit 25 is connected to the signal separating unit 21 and generates, based on the second signal, a second cancelling signal that can suppress ringing caused during processing of the second signal by the amplifying device. The second combining unit 26 is connected to the signal separating unit 21 and the second signal-generating unit 25, and combines the second signal and the second cancelling signal. The second amplifying unit 27 is connected to the second combining unit 26, and amplifies the signal output from the second combining unit 26.

The third combining unit 28 is connected to the first amplifying unit 24 and the second amplifying unit 27, combines the signals output therefrom, and outputs the combined signal from an output terminal 30 connected thereto.

Figure 2:
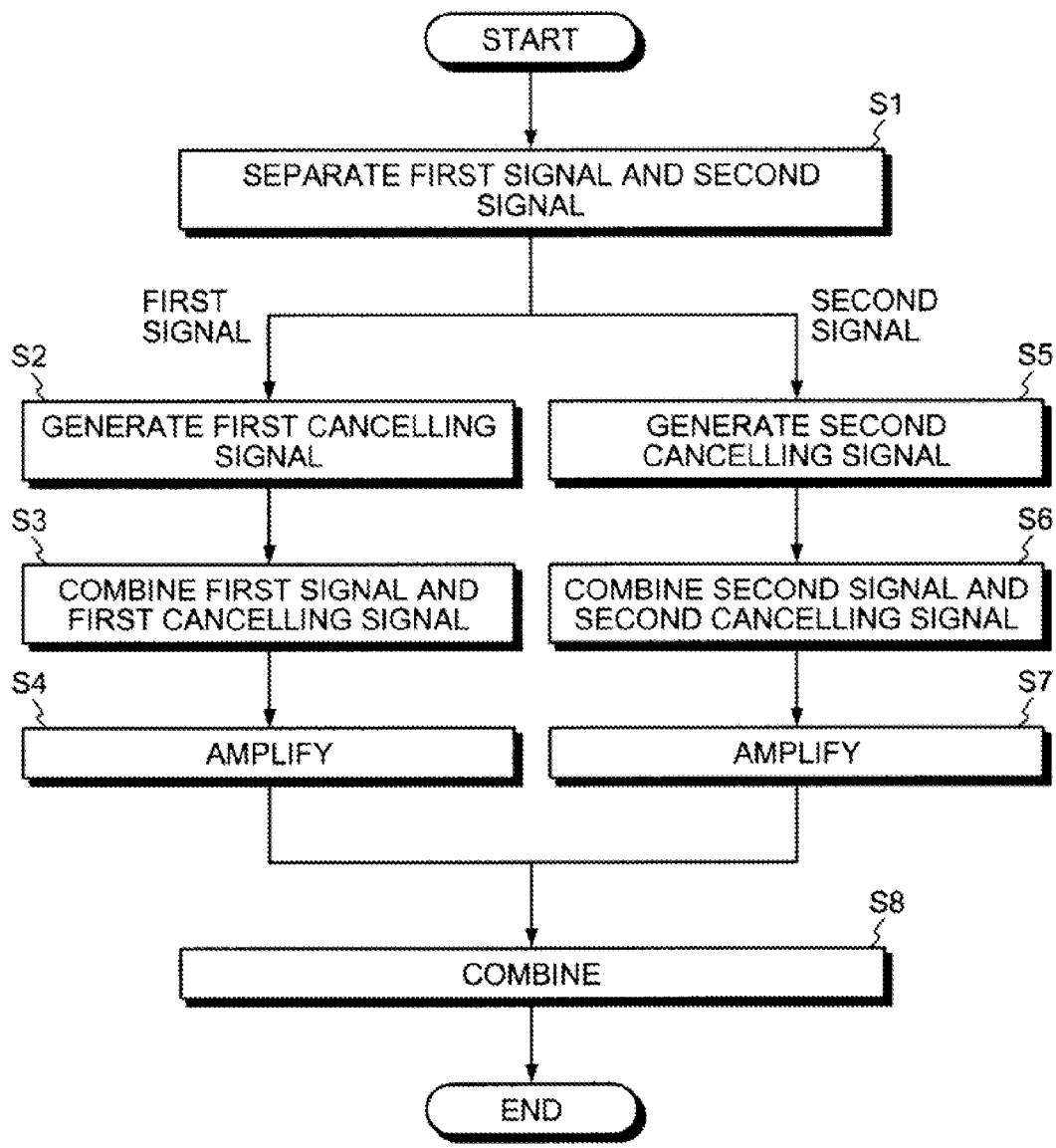
FIG. 2 is a flowchart of an amplifying method according to the first embodiment.

FIG. 2 is a flowchart of an amplifying method according to the first embodiment. As depicted in FIG. 2, when a signal to be amplified is input to the input terminal 29, the signal separating unit 21 separates the first signal and the second signal from the input signal (step S1). The first signal-generating unit 22 generates the first cancelling signal based on the first signal (step S2). The first combining unit 23 generates a third signal by combining the first signal and the first cancelling signal (step S3). The first amplifying unit 24 generates a fourth signal by amplifying the third signal (step S4).

On the other hand, the second signal-generating unit 25 generates the second cancelling signal based on the second signal (step S5). The second combining unit 26 generates a fifth signal by combining the second signal and the second cancelling signal (step S6). The second amplifying unit 27 generates a sixth signal by amplifying the fifth signal (step S7). The third combining unit 28 combines the fourth signal and the sixth signal (step S8), thereby ending the sequence of processes. The signal generated by the third combining unit 28 is output from the output terminal 30.

According to the first embodiment, the influence of AM/AM distortion and/or AM/PM distortion during amplification can be suppressed since the signals separated from the input signal are amplified after the ringing cancelling signals are combined. Thus, deterioration of the high-frequency signal output from the amplifying device can be suppressed.

Figure 3:
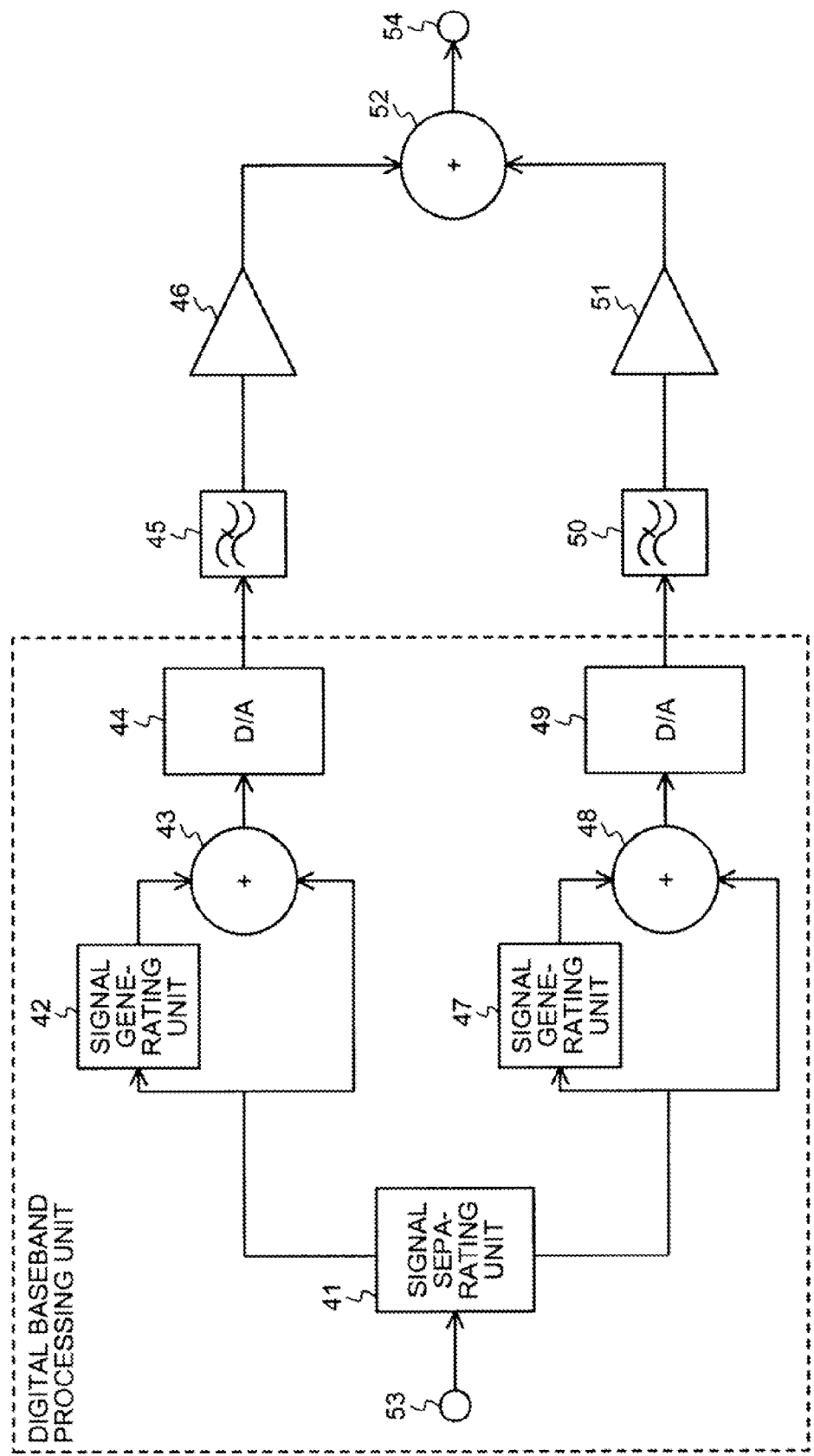
FIG. 3 is a block diagram of an amplifying device according to a second embodiment.

FIG. 3 is a block diagram of an amplifying device according to a second embodiment. As depicted in FIG. 3, the amplifying device includes, for example, a signal generating unit 42 as the first signal-generating unit, a combining unit 43 as the first combining unit, a signal generating unit 47 as the second signal-generating unit, and a combining unit 48 as the second combining unit. The amplifying device further includes a signal separating unit 41, a D/A 44 as a first converting unit, an LPF 45 as a first extracting unit, an amplifying unit 46 as the first amplifying unit. The amplifying device further includes a D/A 49 as a second converting unit, an LPF 50 as a second extracting unit, an amplifying unit 51 as the second amplifying unit, and a combining unit 52 as the third combining unit. The signal separating unit 41, the signal generating unit 42, the combining unit 43, the D/A 44, the signal generating unit 47, the combining unit 48, and the D/A 49 are included in a digital baseband processing unit implemented by a processor such as a DSP, an FPGA, and a CPU.

The signal separating unit 41 is connected to an input terminal 53. The signal generating unit 42 is connected to the signal separating unit 41. The combining unit 43 is connected to the signal separating unit 41 and the signal generating unit 42. The D/A 44 is connected to the combining unit 43. The LPF 45 is connected to the D/A 44. The amplifying unit 46 is connected to the LPF 45.

The signal generating unit 47 is connected to the signal separating unit 41. The combining unit 48 is connected to the signal separating unit 41 and the signal generating unit 47. The D/A 49 is connected to the combining unit 48. The LPF 50 is connected to the D/A 49. The amplifying unit 51 is connected to the LPF 50. The combining unit 52 is connected to the amplifiers 46 and 51. An output terminal 54 is connected to the combining unit 52.

Figure 9:
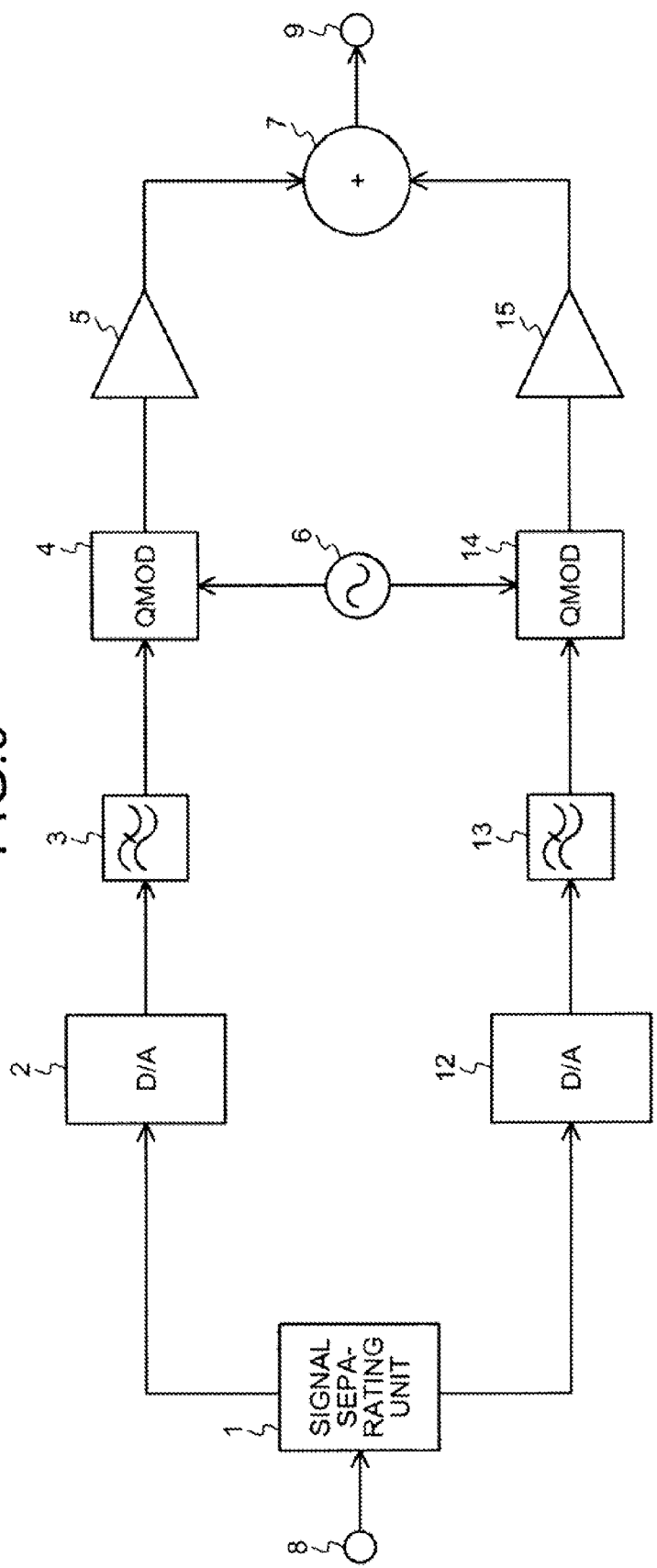
FIG. 9 is a block diagram of a conventional amplifying device.
Figure 10:
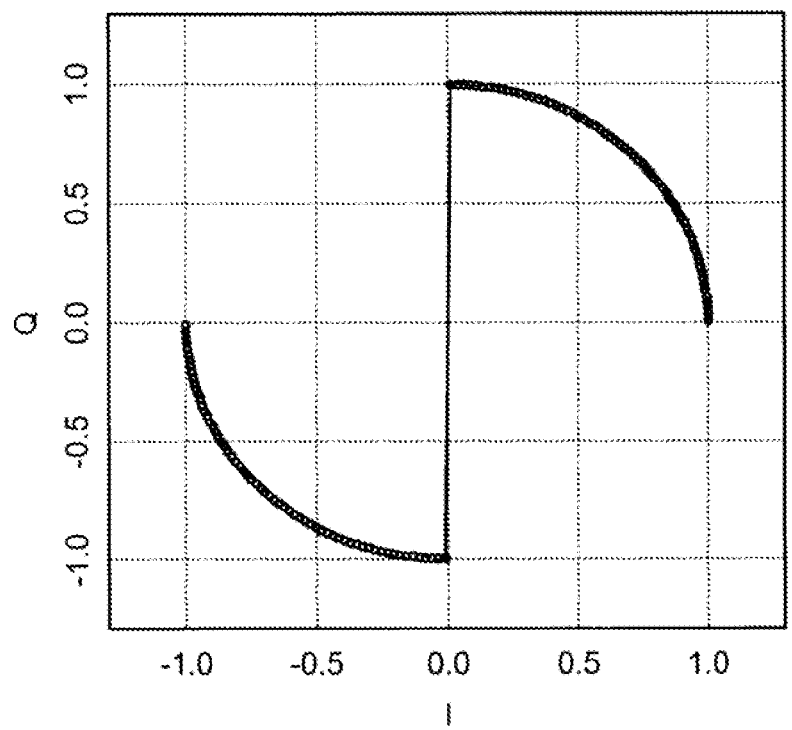
FIG. 10 is a diagram of an example of the constellation of an output signal pair before analog conversion by the conventional amplifying device.

The signal separating unit 41, the D/As 44 and 49, the LPFs 45 and 50, the amplifiers 46 and 51, and the combining unit 52 are the same as those of the amplifying device described as a background technology with reference to FIG. 9, and thus description thereof is omitted. In the second embodiment, however, the D/A 44 converts the signal output from the combining unit 43 into an analog signal. The D/A 49 converts the signal output from the combining unit 48 into an analog signal. The amplifying unit 46 amplifies the signal output from the LPF 45. The amplifying unit 51 amplifies the signal output from the LPF 50.

In a similar manner to the first embodiment, the signal generating unit 42 generates the first cancelling signal based on one signal ($Sc1(t)$) of the signal pair ($Sc1(t)$, $Sc2(t)$) output from the signal separating unit 41. The first cancelling signal can suppress ringing caused in, for example, the signal output from the LPF 45. The combining unit 43 combines one signal ($Sc1(t)$) output from the signal separating unit 41 and the first cancelling signal. A configuration between the signal separating unit 41 and the D/A 44 including the signal generating unit 42 will be described later.

In a similar manner to the first embodiment, the signal generating unit 47 generates the second cancelling signal based on the other signal ($Sc2(t)$) of the signal pair ($Sc1(t)$, $Sc2(t)$) output from the signal separating unit 41. The second cancelling signal can suppress ringing caused in, for example, the signal output from the LPF 50. The combining unit 48 combines the other signal ($Sc2(t)$) output from the signal separating unit 41 and the second cancelling signal.

Figure 4:
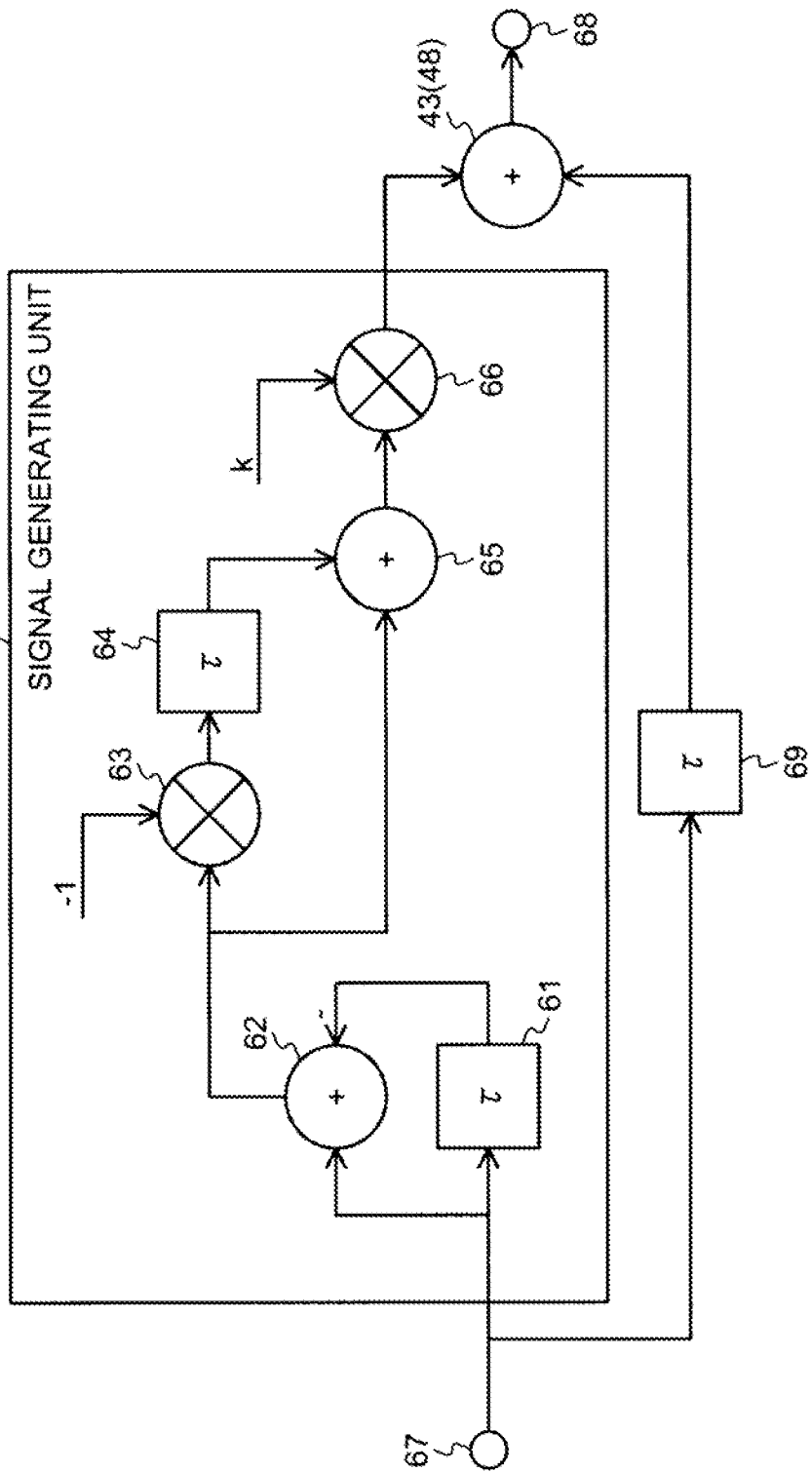
FIG. 4 is a block diagram of a signal generating unit of the amplifying device according to the second embodiment.

FIG. 4 is a block diagram of the signal generating unit of the amplifying device according to the second embodiment. The signal generating unit 42 (or 47) includes, for example, a delay unit 61 and a combining unit 62 as a first detecting unit (or a second detecting unit), a multiplying unit 63 and a delay unit 64 as a first reversing unit (or a second reversing unit), a combining unit 65 as a fourth combining unit (or a fifth combining unit), and a multiplying unit 66 as a first amplitude-adjusting unit (or a second amplitude-adjusting unit).

The delay unit 61 is connected to an input terminal 67 of the signal generating unit 42 (or 47) connected to the signal separating unit 41. The combining unit 62 is connected to the input terminal 67 and the delay unit 61. The multiplying unit 63 is connected to the combining unit 62. The delay unit 64 is connected to the multiplying unit 63. The combining unit 65 is connected to the combining unit 62 and the delay unit 64. The multiplying unit 66 is connected to the combining unit 65. The combining unit 43 (or 48) is connected to the multiplying unit 66. An output terminal 68 is connected to the combining unit 43 (or 48), and to the D/A 44 (or 49).

The delay unit 61 delays the signal ($Sc1(t)$ or $Sc2(t)$) output from the signal separating unit 41 by 1 sampling period. The combining unit 62 combines the signal ($Sc1(t)$ or $Sc2(t)$) input from the input terminal 67 and the signal obtained by delaying the input signal by 1 sampling period by the delay unit 61, and calculates the difference of digital signal sequence of the signal ($Sc1(t)$ or $Sc2(t)$) output from the signal separating unit 41 for 1 sampling period. Thus, any change in the state of the signal ($Sc1(t)$ or $Sc2(t)$) output from the signal separating unit 41 can be detected since the change causes a one-shot pulse to be generated.

The multiplying unit 63 reverses the polarity of the signal output from the combining unit 62 (a one-shot pulse having a first polarity) by multiplying the signal output from the combining unit 62 by −1. The delay unit 64 delays the signal output from the multiplying unit 63 (a one-shot pulse having a second polarity) by 1 sampling period. The combining unit 65 combines the signal output from the combining unit 62

(the one-shot pulse having the first polarity) and the signal output from the delay unit (the one-shot pulse having the second polarity).

Figure 5:
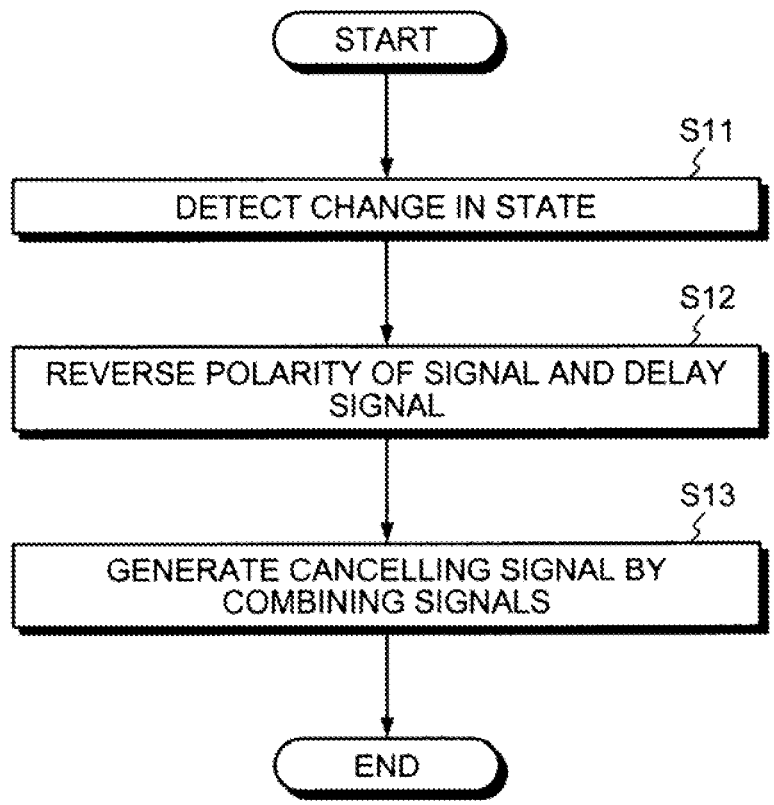
FIG. 5 a flowchart of a generation of a cancelling signal according to the second embodiment.

The multiplying unit 66 generates the first cancelling signal (or the second cancelling signal) by multiplying the signal output from the combining unit 65 by a real number k that is larger than 0 and smaller than 0.5 (see FIG. 5). Thus, the amplitude of the signal output from the combining unit 65 becomes k times larger. In other words, the amplitude of the first cancelling signal (or the second cancelling signal) becomes k times as large as that of the signal output from the combining unit 65. The value of k may be, for example, 0.25.

The first cancelling signal (or the second cancelling signal) output from the multiplying unit 66 is combined to the signal ($Sc1(t)$ or $Sc2(t)$) input from the input terminal 67 by the combining unit 43. A delay unit 69 is provided between the input terminal 67 and the output terminal 68. The delay unit 69 delays the signal ($Sc1(t)$ or $Sc2(t)$) input from the input terminal 67 by 1 sampling period. The delay unit 69 causes the timings of the first cancelling signal (or the second cancelling signal) and the signal ($Sc1(t)$ or $Sc2(t)$) input from the input terminal 67 to match with each other at the combining unit 43 when the signals are combined. The delay unit 69 is omitted in FIG. 3.

The entire flow of an amplifying method according to the second embodiment is the same as that described in the first embodiment with reference to FIG. 2, and thus description thereof is omitted.

FIG. 5 is a flowchart of a generation of a cancelling signal according to the second embodiment. As depicted in FIG. 5, the delay unit 61 and the combining unit 62 of the signal generating unit 42 (or 47) detect that the state of the signal ($Sc1(t)$ or $Sc2(t)$) output from the signal separating unit 41 has changed (step S11). The multiplying unit 63 and the delay unit 64 of the signal generating unit 42 (or 47) reverse the polarity of the one-shot pulse having the first polarity and output when the state of the signal ($Sc1(t)$ or $Sc2(t)$) output from the signal separating unit 41 changes (the one-shot pulse having the second polarity), and delay the one-shot pulse having the second polarity for 1 sampling period (step S12). The combining unit 65 of the signal generating unit 42 (or 47) combines the one-shot pulse having the first polarity and the one-shot pulse having the second polarity, and the multiplying unit 66 generates the first cancelling signal (or the second cancelling signal) by multiplying the composite signal by a coefficient k (step S13).

Figure 6:
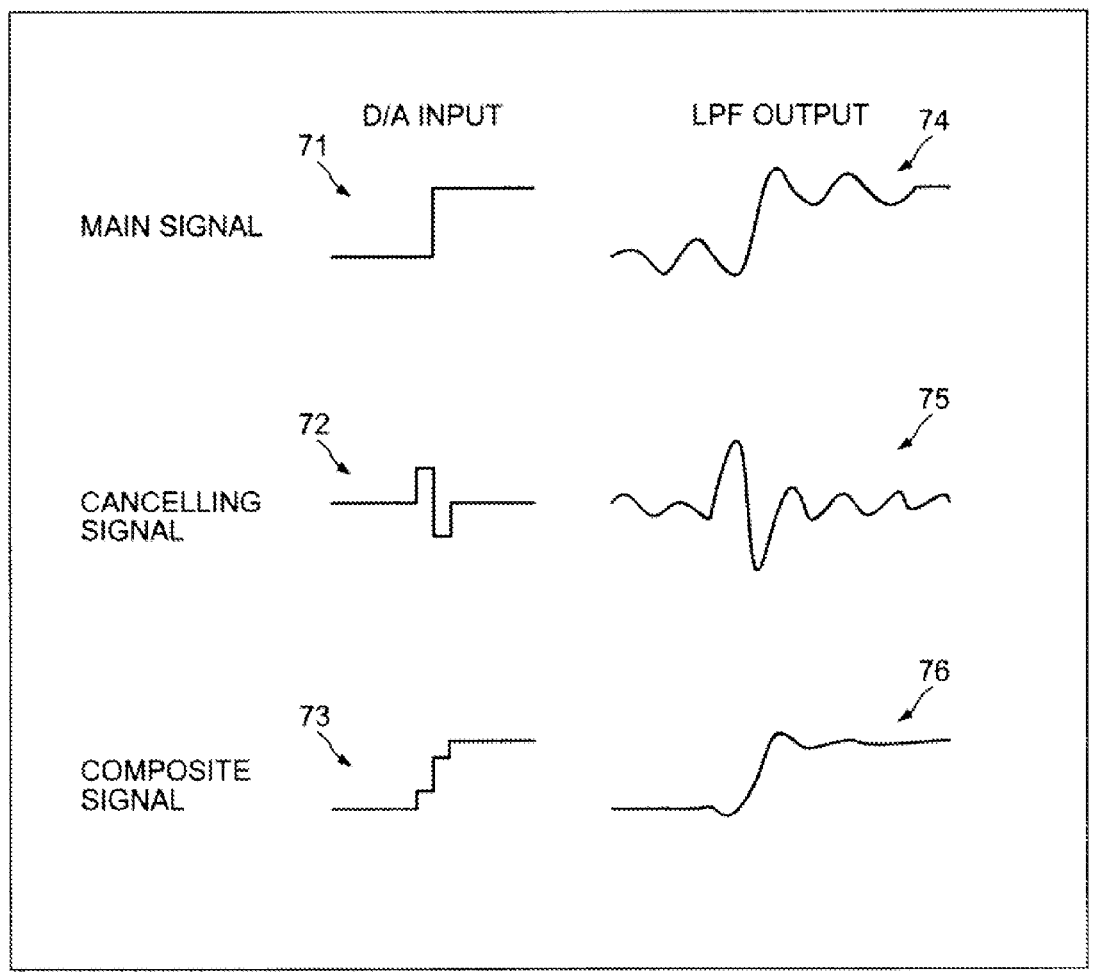
FIG. 6 is a diagram of a waveform of a signal at a discontinuous point.

FIG. 6 is a diagram of a waveform of a signal at a discontinuous point. As depicted in FIG. 6, for a waveform 71 of the main signal input to the D/A 44 (or 49), a cancelling signal having the waveform denoted by the sign 72 is generated. A composite signal having the waveform denoted by the sign 73 can be obtained by combining the main signal having the waveform 71 and the cancelling signal having the waveform 72. In the example of FIG. 6, the amplitude of the cancelling signal is 0.25 times as large as that of the main signal. A waveform 74 of the main signal, a waveform 75 of the cancelling signal, and a waveform 76 of the composite signal after the folded components are removed by the LPF 45 (or 50) in this case are also depicted in FIG. 6. It can be seen that ringing is suppressed in the waveform 76 of the composite signal after passing through the LPF 45 (or 50), compared to the waveform 74 of the main signal.

Figure 7:
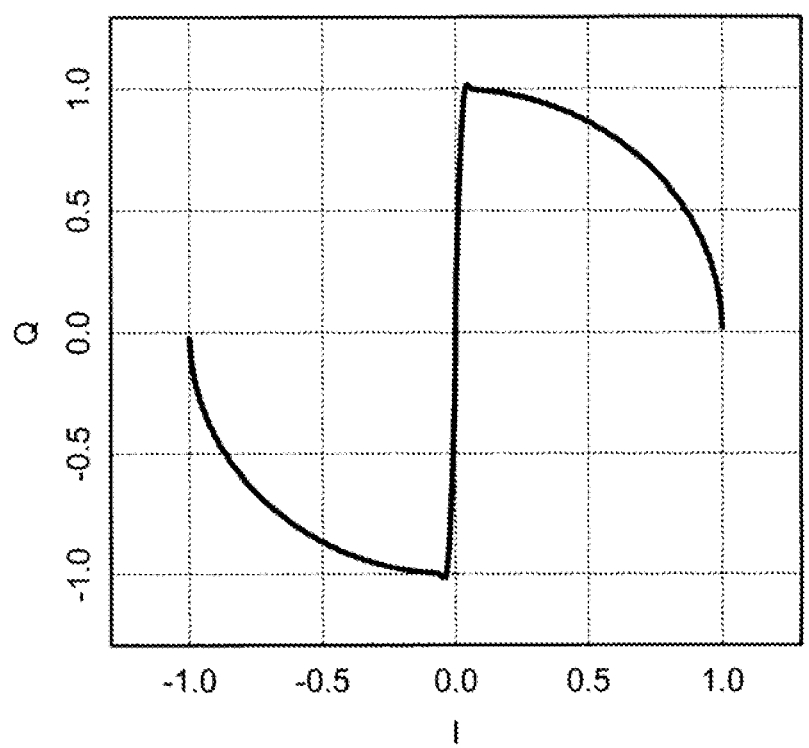
FIG. 7 is a diagram of an example of the constellation of an output signal pair that has passed through a smoothing filter (LPF) after analog conversion by the amplifying device according to the second embodiment.
Figure 11:
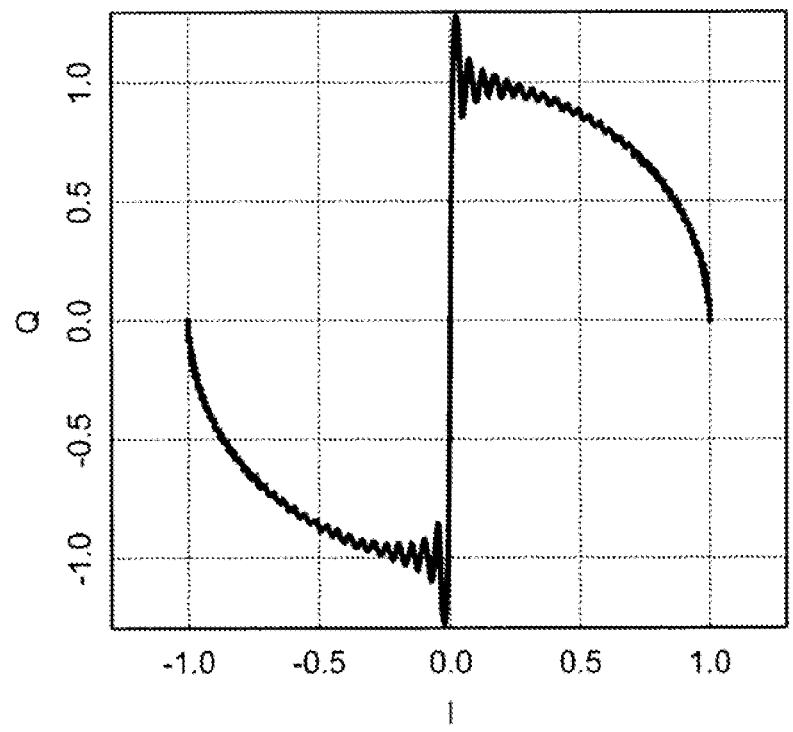
FIG. 11 is a diagram of the constellation of an output signal pair that has passed through a smoothing filter after analog conversion by the conventional amplifying device.

FIG. 7 is a diagram of an example of the constellation of the output signal pair that has passed through the smoothing filter (LPF) after the analog conversion by the amplifying device according to the second embodiment (for 2 tones). As depicted in FIG. 7, the amplitude component due to the influence of ringing is suppressed in the second embodiment, compared to the constellation of the conventional output signal pair (see FIG. 11). According to the second embodiment, the same effect as the first embodiment can be obtained. A quadrature modulating unit and/or a local oscillation unit may be provided in a similar manner to the conventional technology.

Figure 8:
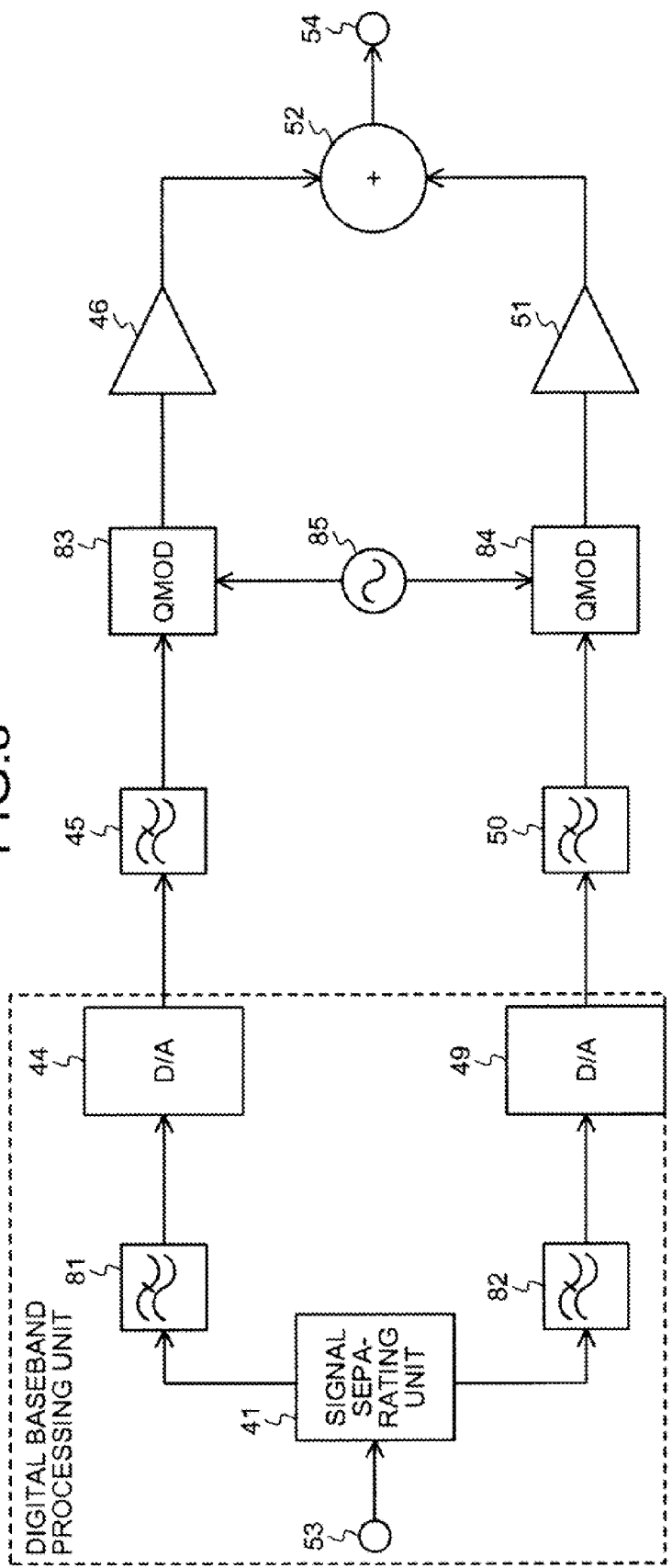
FIG. 8 is a block diagram of an amplifying device according to a third embodiment.

FIG. 8 is a block diagram of an amplifying device according to a third embodiment. As depicted in FIG. 8, the amplifying device according to the third embodiment includes, for example, a finite impulse response (FIR) filter 81 as a first FIR and an FIR filter 82 as a second FIR filter in the amplifying device according to the second embodiment. The FIR filter 81 is provided in place of the signal generating unit 42 and the combining unit 43. The FIR filter 82 is provided in place of the signal generating unit 47 and the combining unit 48. The signal separating unit 41, the FIR filter 81, the D/A 44, the FIR filter 82, and the D/A 49 are included in a digital baseband processing unit implemented by a processor such as the DSP, the FPGA, and the CPU.

The FIR filter 81 has a tap coefficient that can suppress ringing caused in the signal output from the LPF 45. The FIR filter 82 has a tap coefficient that can suppress ringing caused in the signal output from the LPF 50.

In the signal generating unit 42 (or 47) depicted in FIG. 4, the signal input to the input terminal 67 is $Sc_n$, the signals output from the delay unit 61 and the delay unit 69 are $Sc_{n-1}$, and the signal output from the delay unit 64 is $Sc_{n-2}$. $Sc_n$ is a signal input to the input terminal 67 at the time nT, $Sc_{n-1}$ is a signal input to the input terminal 67 at the time (n−1)T, and $Sc_{n-2}$ is a signal input to the input terminal 67 at the time (n−2)T, where T is the sampling period.

The signal output from the combining unit 62 is $Sc_n - Sc_{n-1}$. The signal output from the multiplying unit 63 is $-(Sc_n - Sc_{n-1})$, and the signal output from the delay unit 64 is $-(Sc_{n-1} - Sc_{n-2})$. The signal output from the combining unit 65 is $[Sc_n - Sc_{n-1} - (Sc_{n-1} - Sc_{n-2})]$. Since the coefficient k is multiplied, the signal output from the multiplying unit 66 is $[Sc_n - Sc_{n-1} - (Sc_{n-1} - Sc_{n-2})] \times k$. The signal output from the combining unit 43 is $[Sc_n - Sc_{n-1} - (Sc_{n-1} - Sc_{n-2})] \times k + Sc_{n-1}$. Thus, the signal $y_n$ output from the combining unit 43 at the time nT is represented by the following equation (8).

$$y_n = [Sc_n - Sc_{n-1} - (Sc_{n-1} - Sc_{n-2})] \times k + Sc_{n-1}$$

$$= (Sc_n - 2Sc_{n-1} + Sc_{n-2}) \times k + Sc_{n-1}$$

$$= k \times Sc_n + (1 - 2k) \times Sc_{n-1} + k \times Sc_{n-2}$$

(8)

The equation (8) is the same as an equation representing an FIR filter. That is, the FIR filter is equivalent to the configuration depicted in FIG. 4. Thus, from the equation (8), the tap coefficient for the current signal input to the FIR filter 81 (or 82) is k, the tap coefficient for the signal 1 sample before is (1−2k), and the tap coefficient for the signal 2 samples before is k. $y_n$ is represented by the following equation (9) when k=0.25.

$$y_n = 0.25 \times Sc_n + 0.5 \times Sc_{n-1} + 0.25 \times Sc_{n-2} \tag{9}$$

In a similar manner to the amplifying device described as a background technology with reference to FIG. 9, the amplifying device according to the third embodiment includes a QMOD 83 between the LPF 45 and the amplifying unit 46, a QMOD 84 between the LPF 50 and the amplifying unit 51, and a local oscillation unit 85 connected between the QMODs 83 and 84. Other components are the same as the second embodiment. The QMODs 83 and 84 and the local oscillation unit 85 are the same as those of the amplifying device described as a background technology with reference to FIG. 9, and thus description thereof is omitted. According to the third embodiment, the same effect as the first embodiment can be obtained. Similar to the second embodiment, the QMODs and the local oscillation unit may be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying device comprising:
    a signal separating unit that separates a first signal and a second signal from an input signal;
    a first signal-generating unit that generates, based on the first signal, a first cancelling signal that can suppress ringing caused during processing of the first signal;
    a first combining unit that combines the first signal and the first cancelling signal;
    a first amplifying unit that amplifies a signal output from the first combining unit;
    a second signal-generating unit that generates, based on the second signal, a second cancelling signal that can suppress ringing caused during processing of the second signal;
    a second combining unit that combines the second signal and the second cancelling signal;
    a second amplifying unit that amplifies a signal output from the second combining unit; and
    a third combining unit that combines a signal output from the first amplifying unit and a signal output from the second amplifying unit.

2. The amplifying device according to claim 1, wherein the first signal-generating unit includes:
    a first detecting unit that detects a change in a state of the first signal and generates a signal having a first polarity;
    a first reversing unit that generates a signal having a second polarity by reversing the polarity of a signal output from the first detecting unit; and
    a fourth combining unit that generates the first cancelling signal by combining the signal output from the first detecting unit and a signal output from the first reversing unit, and
the second signal-generating unit includes:
    a second detecting unit that detects a change in a state of the second signal and generates a signal having a first polarity;
    a second reversing unit that generates a signal having a second polarity by reversing the polarity of a signal output from the second detecting unit; and
    a fifth combining unit that generates the second cancelling signal by combining the signal output from the second detecting unit and a signal output from the second reversing unit.

3. The amplifying device according to claim 2, further comprising:
    a first amplitude-adjusting unit that adjusts the amplitude of the first cancelling signal to an amplitude that is more than 0 and less than 0.5 times greater, and
    a second amplitude-adjusting unit that adjusts the amplitude of the second cancelling signal to an amplitude that is more than 0 and less than 0.5 times greater.

4. The amplifying device according to claim 1, further comprising:
    a first converting unit that is provided between the first combining unit and the first amplifying unit and converts the signal output from the first combining unit into an analog signal;
    a first extracting unit that is provided between the first combining unit and the first amplifying unit and extracts a component corresponding to a band of frequency of the first signal from a signal output from the first converting unit;
    a second converting unit that is provided between the second combining unit and the second amplifying unit and converts the signal output from the second combining unit into an analog signal; and
    a second extracting unit that is provided between the second combining unit and the second amplifying unit and extracts a component corresponding to a band of frequency of the second signal from a signal output from the second converting unit.

5. The amplifying device according to claim 1, wherein
    a first FIR filter having a tap coefficient that can suppress ringing caused during processing of the first signal is provided in place of the first signal-generating unit and the first combining unit,
    the first signal passes through the first FIR filter to generate a composite signal of the first signal and the first cancelling signal,
    a second FIR filter having a tap coefficient that can suppress ringing caused during processing of the second signal is provided in place of the second signal-generating unit and the second combining unit, and
    the second signal passes through the second FIR filter to generate a composite signal of the second signal and the second cancelling signal.

6. The amplifying device according to claim 5, wherein with respect to the first FIR filter and the second FIR filter, a tap coefficient for a current signal input to each FIR filter is k, a tap coefficient for a signal input to each FIR filter 1 sample before is (1-2k), and a tap coefficient for a signal input to each FIR filter 2 samples before is k, where k is a real number between 0 and 0.5.

7. The amplifying device according to claim 6, wherein k is 0.25.

8. An amplifying method comprising:
    separating a first signal and a second signal from an input signal;
    generating, based on the first signal, a first cancelling signal that can suppress ringing caused during processing of the first signal;
    generating a third signal by combining the first signal and the first cancelling signal;
    generating a fourth signal by amplifying the third signal;
    generating, based on the second signal, a second cancelling signal that can suppress ringing caused during processing of the second signal;
    generating a fifth signal by combining the second signal and the second cancelling signal;

generating a sixth signal by amplifying the fifth signal; and
combining the fourth signal and the sixth signal.

9. The amplifying method according to claim 8, further comprising:

detecting a change in a state of the first signal and generating a seventh signal of a single polarity;

generating an eighth signal by reversing the polarity of the seventh signal and delaying the seventh signal by 1 sample;

generating the first cancelling signal by combining the seventh signal and the eighth signal;

detecting a change in a state of the second signal and generating a ninth signal of a single polarity;

generating a tenth signal by reversing the polarity of the ninth signal and delaying the ninth signal by 1 sample; and generating the second cancelling signal by combining the ninth signal and the tenth signal.

\* \* \* \* \*